United States Patent [19]

Schmidt

[11] 4,032,866
[45] June 28, 1977

[54] LOW LOSS FREQUENCY RESPONSE CORRECTIVE NETWORK

[75] Inventor: Hans-Joachim Schmidt, Nurnberg, Germany

[73] Assignee: Tekade Felten & Guilleaume Fernmeldeanlagen GmbH, Nurnberg, Germany

[22] Filed: Mar. 12, 1976

[21] Appl. No.: 666,229

[30] Foreign Application Priority Data

Mar. 22, 1975 Germany ............... 2512805

[52] U.S. Cl. ............... 333/28 R; 333/32; 333/70 CR; 333/77; 333/81 R
[51] Int. Cl.² ............... H03H 7/10; H03H 7/16; H03H 7/38; H04B 03/14
[58] Field of Search ............... 333/70 R, 76, 28 R, 333/70 CR, 18, 32, 75, 77, 78, 81 R

[56] References Cited

UNITED STATES PATENTS

| 2,024,900 | 12/1935 | Wiener et al. | 333/70 R X |
|---|---|---|---|
| 2,682,037 | 6/1954 | Bobis et al. | 333/76 X |
| 3,325,753 | 6/1967 | Shearer et al. | 333/76 X |
| 3,336,539 | 8/1967 | Kwartiroff et al. | 333/28 X |
| 3,750,052 | 7/1973 | Hermanutz | 333/28 R |

*Primary Examiner*—Eli Lieberman
*Assistant Examiner*—Marvin Nussbaum
*Attorney, Agent, or Firm*—Michael J. Striker

[57] ABSTRACT

A low loss corrective network for obtaining a desired overall frequency response comprises a plurality of tunable resonant circuit stages which are operative for modifying the frequency response over respective portions of the frequency spectrum. Each resonant stage comprises a variable differential capacitor having two stator plate input terminals and a rotor plate output terminal. Each stator plate input terminal is connected to respective end terminals of a source. A single voltage divider common to all of the stages has two end terminals which are connected with the source and which are also commonly connected with all of the respective stator plate input terminals of the individual stages, and a tap point located intermediate the end terminals of the divider which is commonly connected with all of the respective rotor plate output terminals of the individual stages. Moreover, matching resistors and inductors are employed to compensate for the capacitive loading presented by the differential capacitors. Finally, decoupling resistors are connected between the respective rotor plate output terminals of successive pairs of resonant stages.

16 Claims, 2 Drawing Figures

LOW LOSS FREQUENCY RESPONSE CORRECTIVE NETWORK

BACKGROUND OF THE INVENTION:

The present invention relates to a low loss corrective network and, more particularly, to an equalization circuit arrangement which is employed in transmission systems in order to obtain a desired overall frequency response.

In the prior art, it is generally known to provide corrective networks for improving the frequency-response characteristics of a transmission system. These corrective networks have adjustable components which either increase or decrease the response of a transmission system at a desired frequency or band of frequencies across the overall frequency spectrum. These adjustable components are operative to generate resonances having peaks and valleys so as to set the amplitude (gain or loss) and/or the width of the resonances and/or the center frequency at which the resonance occurs. By using any or all of these parameters, it is possible to either boost or suppress respective portions of the frequency-response characteristic.

One prior-art device employs a variable capacitor, such as a differential capacitor having two similar sets of stator plates and one set of rotor plates. When the rotor is turned, the capacitance of one section is increased, while the capacitance of the other section is decreased. In addition, variable inductors are connected in series with the set of rotor plates. In this manner, resonances may be generated by adjusting either or both the differential capacitor or the variable inductor of each stage.

However, this prior-art device is possessed of many disadvantages. First of all, each stage has its own voltage divider constituted of a pair of resistors having two end terminals connected with the input signal source, and also having a tap point located intermediate the end terminals of the divider which is connected to the rotor plate terminal. The device further includes a separate output resistor, across which the output signal is taken off, and additional resistors connected intermediate each stage and the output resistor.

The effect of this plurality of resistors is to greatly increase the attenuation characteristic of each stage. The cumulative loss of combining several of such stages is, of course, greatly increased as a direct function of the number of such resonant stages that are actually required in a particular application.

Still another drawback of the prior-art device is that its input impedance has a predominantly capacitive nature. This is especially undesirable when it is desired to match the stages to a source having an internal impedance which is entirely resistive.

Finally, the prior-art decoupling arrangements have not proven altogether satisfactory. Thus, undesired resonances, in contrast to desired resonances, have not been reliably prevented from appearing in the output signal.

SUMMARY OF THE INVENTION

Accordingly, it is a general object of the present invention to overcome the disadvantages of the prior art.

An additional object of the present invention is to provide a corrective network possessed of low attenuation losses.

A further object of the present invention is to eliminate the need for active amplifying stages to offset the high attenuation characteristics of prior-art corrective networks.

Yet a further object of the present invention is to match the input impedance of the plurality of resonant circuit stages so that the input impedance has a predominantly resistive nature.

Still another object of the present invention is to improve the decoupling between successive stages.

In keeping with these objects and others which will become apparent hereinafter, one feature of the invention resides in a low loss corrective network for obtaining a desired overall frequency response which comprises a plurality of tunable resonant circuit stages which are operative for modifying the frequency response over respective portions of the frequency spectrum. Each circuit stage has an input end connected with a source, and an output end. The network further includes a single voltage divider which is common to all of these stages. The divider has two end terminals which are connected with the source and which are also commonly connected with all of the respective input ends of the individual stages. Located intermediate the end terminals of the divider, a tap point is provided which is commonly connected with all of the respective output ends of the individual stages.

The feature of providing a single voltage divider constituted of a voltage-dropping resistor connected between one end terminal of the source and the tap point, and an output resistor connected between the tap point and another end terminal of the source greatly reduces the lossy nature of prior-art corrective networks.

In accordance with the invention, each resonant circuit stage comprises a variable capacitor, such as a differential capacitor having two sets of stator plates and one set of rotor plates. At least one of these stages is provided with two similar matching resistors, each symmetrically connected between a respective one of the stator plate terminals and a respective one of the end terminals of the source. In addition, a compensating matching impedance is connected across the end terminals of the source and is constituted of a compensating resistor having a value about two times that of a matching resistor and further constituted of a compensating inductor having an equivalent impedance about equal to that of the differential capacitor multiplied by that of the matching resistor squared.

The feature of providing the matching resistors and the compensating matching impedance thus corrects the capacitive nature of the particular stage in the corrective network. By dimensioning the matching resistors and the compensating impedance in the manner indicated above, the input impedance of the plurality of resonant circuit stages can be made entirely resistive.

In accordance with yet another feature of the present invention, decoupling resistors are connected between the rotor plate output terminals of successive pairs of stages. This feature obviates the prior-art drawback of having undesired resonances appearing in the frequency-response characteristic of the corrective network.

The novel features which are considered as characteristic for the invention are set forth in particular in the appended claims. The invention itself, however, both as to its construction and its method of operation, together with additional objects and advantages thereof, will be best understood from the following description of specific embodiments when read in connection with the accompanying drawings.

DESCRIPTION OF THE PREFERRED EMBODIMENTS

Figure 1:
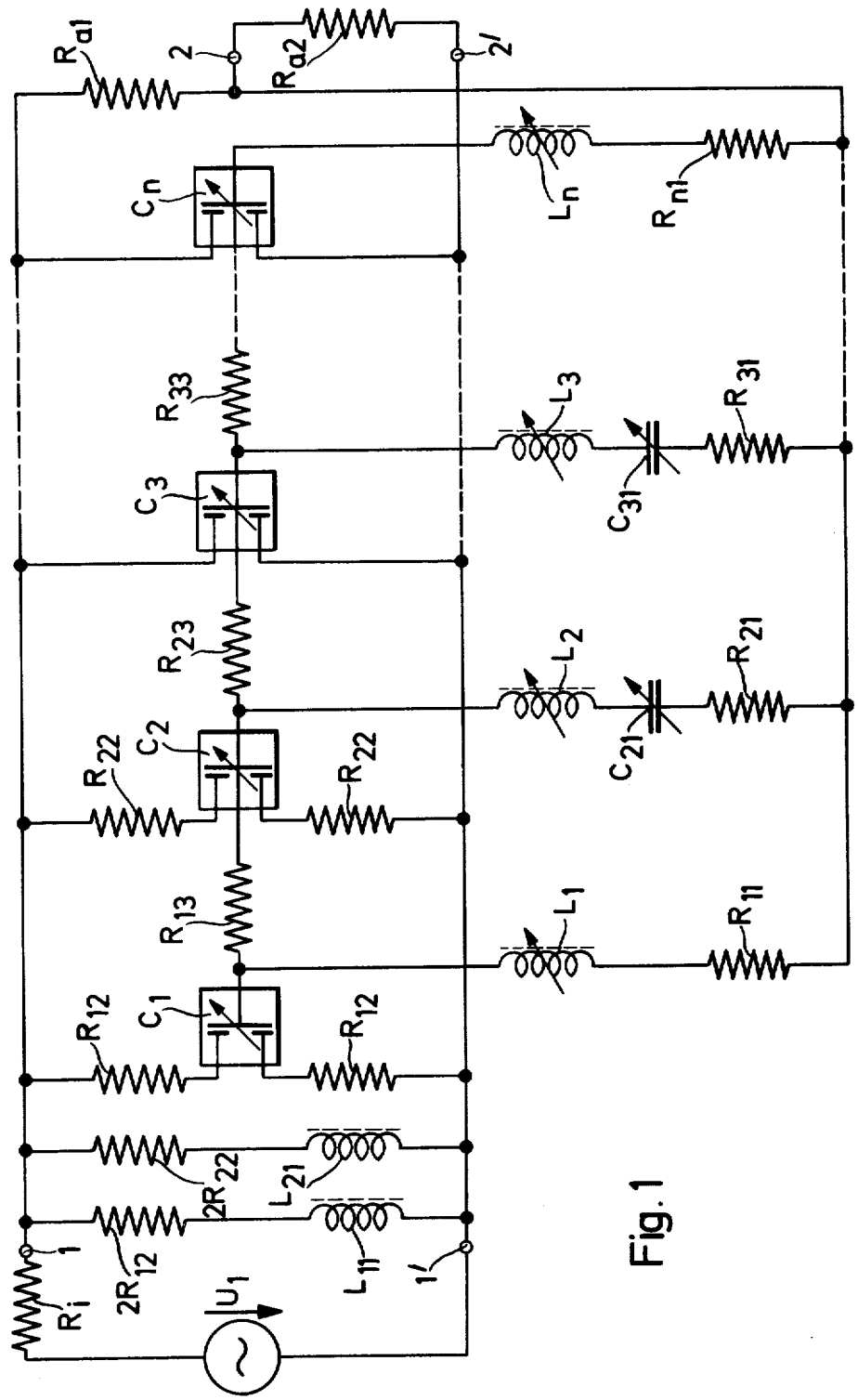
FIG. 1 illustrates a diagrammatic view of an embodiment of a corrective network in accordance with the present invention.

Turning firstly to FIG. 1 of the drawing, a simplified version of a corrective network according to the present invention is shown to be comprised of a plurality of tunable resonant circuit stages which are each connected with a source. The function of these tunable stages is to modify the frequency response over a respective portion of the frequency spectrum in order to obtain a desired overall frequency-response characteristic.

In order to facilitate the description of the various stages, the stages are sequentially numbered from parameter $x = 1$ to parameter $x = n$; and every component of any particular stage (e.g. $x$) is identified by the same parameter $x$. The number of stages depends, of course, upon the application, i.e., how many resonant peaks and valleys are to be generated by the corrective network.

In FIG. 1, the input signal source $u_1$ has a pair of end terminals 1, 1'. The internal impedance of the source is diagrammatically represented by resistor $R_i$.

Each resonant circuit stage comprises a variable capacitor, such as a differential capacitor $C_x$ ($C_1, C_2, C_3, C_x \ldots C_n$). Variable capacitor $C_x$ has two symmetrical sets of stator plates having two input terminals and one set of rotor plates having an output terminal. When the rotor is turned, the capacitance at one stator input terminal increases, while the capacitance at the other stator input terminal decreases. The two stator plate terminals of each stage are connected to respective ones of the ends terminals 1, 1' of the source.

In addition, each stage comprises a resistor $R_{x1}$ ($R_{11}, R_{21}, R_{31}, R_{x1} \ldots R_{n1}$) and a variable inductor $L_x$ ($L_1, L_2, L_3, L_x \ldots L_n$) which are connected in series with each other and are connected between the rotor plate terminal and a common terminal or tap point 2 of a voltage divider. The single voltage divider is common to all of the stages and is comprised of a voltage-dropping resistor $R_{a1}$ connected between end terminal 1 of the source and the tap point 2, and an output resistor $R_{a2}$ having ends 2, 2' which are respectively connected between the tap point 2 and the other end terminal 1' of the source.

As can be seen in FIG. 1, the end terminals of the divider are respectively connected with the end terminals 1, 1' of the source and are also commonly connected with all of the respective input ends (stator plate input terminals) of the individual stages. The tap point 2 of the divider which is located intermediate the end terminals of the divider is commonly connected with all of the respective output ends (rotor plate output terminals) of the individual stages.

Thus, the common connection of the various output ends of the resonant stages at the point 2 dispenses with the prior-art requirement of having to provide for a plurality of voltage dividers, each being associated with a different stage. This feature leads to a lesser energy consumption as compared with the prior-art devices and to a lower overall attenuation for the network.

By the use of a common tap point 2, it is especially important to efficiently decouple the various stages in order to prevent feedback and the formation of undesired resonances across portions of the frequency spectrum. As shown in FIG. 1, decoupling resistors $R_{x3}$ ($R_{13}, R_{23}, R_{33}, R_{x3} \ldots R_{n3}$) are directly connected intermediate the rotor plate output terminals of the resonant circuit stages.

In operation, with the rotor of each differential capacitor $C_x$ placed in the middle position so that the partial capacitance at one stator input terminal corresponds to the partial capacitance at the other stator input terminal, the voltage difference between terminals 2 and 2' is substantially zero. Voltage-dropping resistor $R_{a1}$ has a value which permits some electrical current to flow from the source through output impedance $R_{a2}$ so as to generate an output voltage signal when the rotor of the differential capacitor of each stage is in its middle position.

When the rotor of a stage is moved in either direction away from the middle position, additional electrical current will begin to flow through the output impedance $R_{a2}$. The value of this additional electrical current reaches its maximum when the mid-frequency $w_o$ of the generated resonance is determined by the relationship $$w_o = \frac{1}{\sqrt{L_x \cdot C_x}}.$$

The output signal, which is tapped off of output impedance $R_{a2}$, can thus have a modified frequency response in dependence upon the position of a particular rotor or rotors. If the impedance $R_{a2}$ is selected to be relatively smaller than the voltage-dropping resistor $R_{a1}$, as well as the resistance $R_{x1}$, then it is possible to realize n different resonant peaks or valleys, each resonance being decoupled from the other by the decoupling resistors $R_{x3}$. The maximum value of a peak or valley obtained by fully displacing the rotor of a stage is determined by voltage division and equals the ratio $R_{a1}/R_{a2}$, a value which can be selected at will, depending upon the particular application.

In accordance with the invention, the amplitude or height of an individual resonant peak or valley can be adjusted by moving the rotor of a differential capacitor. The width of these peaks or valleys are determined by the size chosen for the resistor $R_{x1}$. The respective portion of the frequency spectrum, i.e. the frequency at which the resonance occurs, is determined by the capacitance $C_x$ and the inductance $L_x$. Of course, the resonant frequency and the width of the resonances remains substantially constant when the differential capacitor is adjusted.

For many applications, the size of the capacitance $C_x$ which is available in commercial differential capacitors is too large. Thus for example, if it is desired to lower the capacitance of stages 2 and 3, a variable or fixed value compensating capacitor $C_{21}, C_{31}$ ($C_{x1}$) is connected in series with the resistor $R_{21}, R_{31}$ and the inductor $L_2, L_3$ between the rotor plate terminal of stages 2 and 3 and the common tap point 2, respectively. The variable compensating capacitor $C_{x1}$ is operative for adjusting the resonant frequency and the width of the resonances. Furthermore, if the inductance of inductor $L_x$ were not variable but fixed, the use of a variable compensating capacitor would be primarily responsible for adjusting the resonant frequency.

In order to compensate for the capacitive input impedance of the respective stages of the corrective network, two substantially equal correcting or matching resistors $R_{x2}$ ($R_{12}, R_{22}, R_{x2} \ldots R_{nx}$) are each connected between a respective stator plate input terminal and source terminals 1, 1'. As noted above, no current flows out of the rotor plate terminal when the latter is positioned in the middle position of the differential capacitor. Moreover, this branch portion of the network has an equivalent impedance equal to $2R_{x2} + C_x/4$. This relationship is calculated on common electrical circuit principles of addition. It should be kept in mind that the total capacitance $C_x$ of the differential capacitor equals the sum of the partial capacitances $C_{x1}$, $C_{x2}$ attributed to each section. In the middle position, $C_{x1} = C_{x2} = C_x/2$; and the series addition of these capacitances amounts to $C_x/4$. Of course, the two matching resistors add up to $2R_{x2}$.

In order to compensate for the impedance of this aforementioned branch, a compensating matching impedance is connected in a parallel branch across the end terminals 1, 1' of the source and is constituted of a compensating resistor having a value equal to twice that of a matching resistor $R_{x2}$ and a compensating inductor $L_{x1}$ having an equivalent impedance equal to that of the differential capacitor $C_x$ multiplied by that of the matching resistor $R_{x2}$ squared.

By adding up both branches, the equivalent impedance thereof amounts to the real value $2 \cdot R_{x2}$. If both matching branches were added for each stage, then the total loading of n resonant circuit stages in the middle position of the differential capacitor would be all resistive and have the value $2R_{x2}/n$, provided that all matching resistors $R_{x2}$ are all of equal value. If the matching resistors of separate stages have different values, then the total loading would be determined from the known relationship between the parallel connected impedances.

By properly dimensioning the matching resistor $R_{x2}$, it is possible to simply set the input impedance of the corrective network to a predetermined purely resistive value. Of course, the additional loading represented by the voltage divider must be taken into account. Since the customary maximum amplitude of the input signal rarely exceeds 30 percent of nominal and since during operation not all of the stages need be turned, the input impedance of the corrective network remains mostly real and does not vary significantly from the value obtained when the rotor of a differential capacitor is in its middle position. Thus, the internal resistance $R_i$ of the input source need not be especially small since the input impedance of the corrective network can now be matched to the internal resistance $R_i$, no matter how long the connection is between the source $U_1$ and the corrective network.

The use of the matching resistors $R_{x2}$ is not trivial. The use of these matching resistors results in the rather surprising result that they do not effect the capacitance which is effective in the generation of the desired resonances, even if the rotor of the differential capacitor is adjusted to a random position. The original concept of varying the capacitor and changing only the height of the peaks or valleys without simultaneously changing the width or the frequency position of the resonances remains the same. It is only for very wide resonances that the width and/or frequency position will change due to the presence of the matching resistors. However, such very wide resonances do not occur in practical circuits.

In practically-designed corrective networks, not all of the stages need be provided with the above-defined double-branch circuits. For example, if one of the stages has a differential capacitor having a very small relative capacitance, this slightly capacitive nature of this stage need not be corrected, and the double-branch circuit can be omitted. Furthermore, if the value of the capacitance $C_x$ and the value of the matching resistor $R_{x2}$ are selected so that at least some of the stages have the same time constant, then all of these stages can be simultaneously compensated by a single branch comprised only of a single matching resistor $2R_{x2}$ and a compensating inductor $L_{x1}$.

The use of matching resistors $R_{x2}$, however, results in the reduction of the current flow out of the rotor plate terminals and thus leads to a limitation of the relative amplitude of the resonances relative to the value which they have when the rotor is in the middle position. This latter limitation is generally desirable. If the size of the matching resistors $R_{x2}$ is still not adequate, when the magnitudes of the series resistors $R_{x1}$ can be selected accordingly, It is self-evident that it is also possible to dimension $R_{x1}$ so that it alone limits the size of the resonances to a desired value. In this case, one can omit the resistor $R_{x2}$ from the corrective network.

Figure 2:
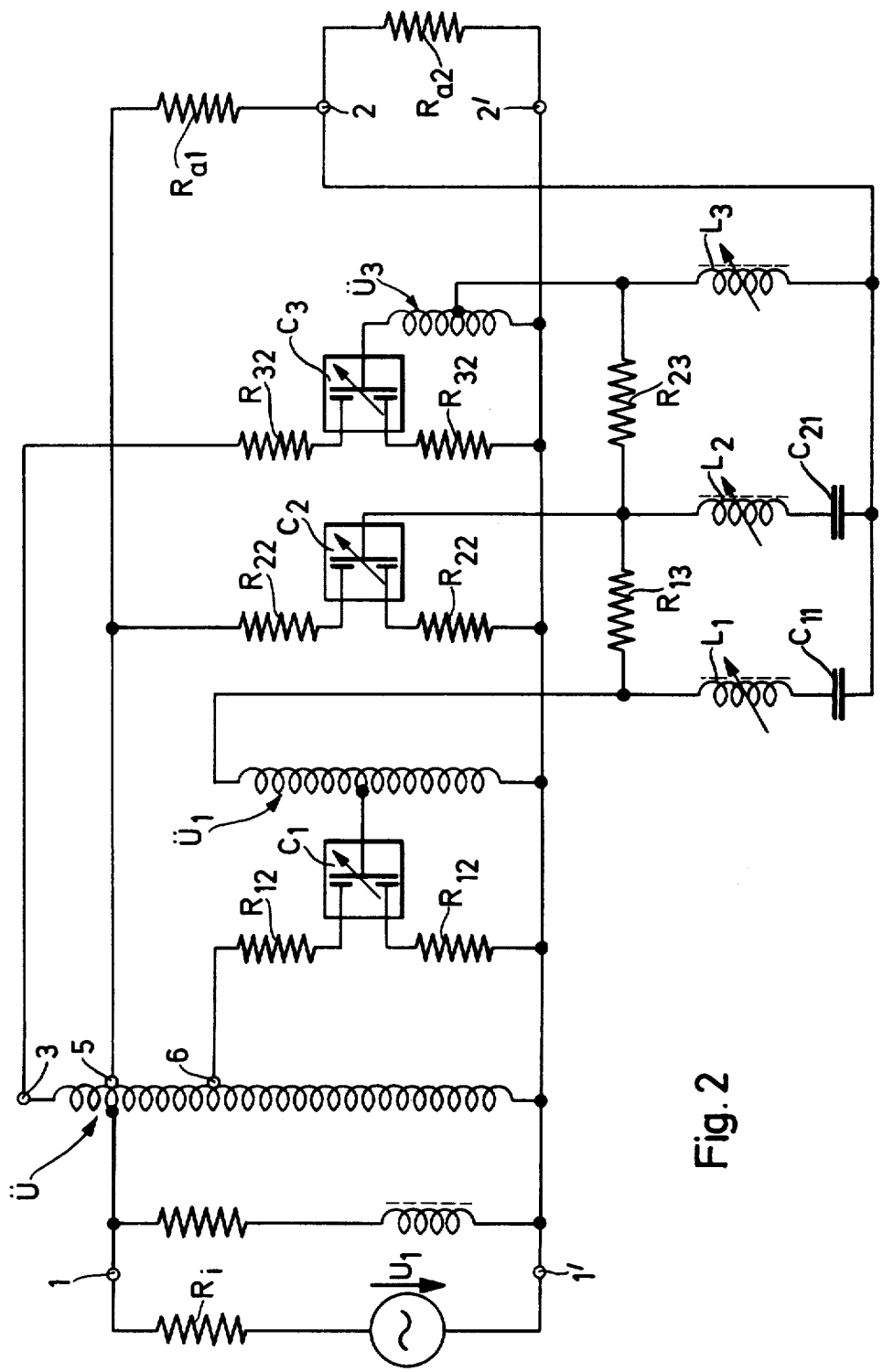
FIG. 2 illustrates a diagrammatic view of another embodiment of a corrective network in accordance with the present invention.

Depending upon the intended use of a corrective network, it frequently arises that capacitance values are required which are different from standard commercial values. FIG. 2 illustrates an embodiment which obviates this difficulty by impedance step-up and step-down conversion. It will be understood that like reference numerals in FIG. 2 identify like parts as discussed in FIG. 1.

The source $u_1$ is connected to a plurality of stages through an input transformer, preferably an autotransformer U which has a plurality of taps 3, 5 and 6 spaced along its winding. Each tap point 3, 5 and 6 is connected to a respective input end of the stages, as desired, i.e. to one of the stator plate input terminals. Thus, tap point 6 is connected to stage 1; tap point 5 is connected to stage 2; and tap point 3 is connected to stage 3. In this manner, matching to the desired capacitive value is realized by voltage step-down and step-up conversion.

In addition, an output transformer $U_x$ ($U_1, U_3, U_x \ldots U_n$) is located intermediate the output end (rotor plate output terminal) of an individual stage and the tap point 2 of the divider. The output transformer $U_x$ has opposite end junctions and tap junction intermediate the latter. At least one of the junctions is connected to the rotor plate output terminal of a particular stage. For example, in stage 1, the tap junction is connected to the rotor plate output terminal. Furthermore, in stage 3, one end junction is connected to the rotor plate output terminal. Of course, not every stage need be provided with an output transformer; for example, see stage 2.

For decoupling purposes, decoupling resistors $R_{x3}$ ($R_{13}, R_{23}$) are connected intermediate the rotor plate output terminals of the respective pairs of stages. Thereby, in accordance with the invention, the corrective network offers a very minimal attenuation characteristic, substantial elimination of any desired resonances across the frequency spectrum, and a purely resistive input impedance.

It will be understood that each of the elements described above, or two or more together, may also find a useful application in other types of constructions differing from the types described above.

While the invention has been illustrated and described as embodied in a low loss frequency response corrective network, it is not intended to be limited to the details shown, since various modifications and structural changes may be made without departing in any way from the spirit of the present invention.

Without further analysis, the foregoing will so fully reveal the gist of the present invention that others can by applying current knowledge readily adapt it for various applications without omitting features that, from the standpoint of prior art, fairly constitute essential characteristics of the generic or specific aspects of this invention.

What is claimed as new and desired to be protected by Letters Patent is set forth in the appended claims:

1. A corrective equalizer network for obtaining a desired attenuation versus frequency characteristic, comprising a source having output terminals; a plurality of nonactive stages each having an input for receiving input signals from the source, an output for supplying output signals to a load, and adjustable reactance elements intermediate the respective input and output of every stage, one of said reactance elements being a differential capacitor having two stator plate input terminals connected across the output terminals of the source, and a rotor plate output terminal operatively connected to the load; means for tuning at least one of the adjustable reactance elements of each stage so as to set every stage to be resonant at different frequencies of the frequency spectrum of the input signals; and means for adjusting at least one of the adjustable reactance elements of each stage independently from other adjustable reactance elements of every other stage so as to selectively vary the amplitude of at least a selected one of the respective frequencies of the spectrum for altering the level of attenuation at said selected one frequency, whereby the output signals supplied to the load have the desired attenuation versus frequency characteristic for the entire frequency spectrum.

2. A network as defined in claim 1, wherein at least one of the stages further comprises two similar matching resistors, each symmetrically connected between a respective one of the stator plate input terminals and a respective one of the output terminals of the source; and further comprising a compensating matching impedance connected across the output terminals of the source and constituted of a compensating resistance having a value about two times that of a matching resistor and further constituted of a compensating inductor having an equivalent impedance about equal to that of the differential capacitor multiplied by that of the matching resistor squared.

3. A network as defined in claim 1, wherein at least one of the stages further comprises a variable inductor connected between the rotor plate output terminal and the other end of the dropping resistor.

4. A network as defined in claim 1, wherein at least one of the stages further comprises a series resistor connected between the rotor plate output terminal and the other end of the dropping resistor.

5. A network as defined in claim 1, wherein at least one of the stages further comprises a series compensating capacitor connected between the rotor plate output terminal and the other end of the dropping resistor.

6. A corrective equalizer network for obtaining a desired attenuation versus frequency characteristic, comprising a source having output terminals; a plurality of non-active stages each having an input for receiving input signals from the source, an output for supplying output signals to a load, and adjustable reactance elements intermediate the respective input and output of every stage, one of said reactance elements being a differential capacitor having two stator plate input terminals connected across the output terminals of the source, and a rotor plate output terminal operatively connected to the load; means for tuning at least one of the adjustable reactance elements of each stage so as to set every stage to be resonant at different frequencies of the frequency spectrum of the input signals; means for adjusting at least one of the adjustable reactance elements of each stage independently from other adjustable reactance elements of every other stage so as to selectively vary the amplitude of at least a selected one of the respective frequencies of the spectrum for altering the level of attenuation at said selected one frequency, whereby the output signals supplied to the load have the desired attenuation versus frequency characteristic for the entire frequency spectrum; and decoupling means connected between respective rotor plate output terminals of successive stages.

7. A network as defined in claim 6, wherein each two stages constitute pairs; and wherein said decoupling means comprises a plurality of decoupling resistors, each having opposite ends directly connected between the respective rotor plate terminals of a pair of stages.

8. A corrective equalizer network for obtaining a desired attenuation versus frequency characteristic, comprising a source including an input transformer having a pair of output terminals and a plurality of tap terminals located intermediate the output terminals; a plurality of non-active stages each having an input connected across two of the terminals of the transformer for receiving input signals from the source, an output for supplying output signals to a load, and adjustable reactance elements intermediate the respective input and output of every stage; means for tuning at least one of the adjustable reactance elements of each stage so as to set every stage to be resonant at different frequencies of the frequency spectrum of the input signals; and means for adjusting at least one of the adjustable reactance elements of each stage independently from other adjustable reactance elements of every other stage so as to selectively vary the amplitude of at least a selected one of the respective frequencies of the spectrum for altering the level of attenuation at said selected one frequency, whereby the output signals supplied to the load have the desired attenuation versus frequency characteristic for the entire frequency spectrum.

9. A corrective equalizer network for obtaining a desired attenuation versus frequency characteristic, comprising a source having output terminals; a plurality of non-active stages each having an input connected across the output terminals of the source for receiving input signals from the latter, an output for supplying output signals to a load, and adjustable reactance elements intermediate the respective input and output of every stage; means for tuning at least one of the adjustable reactance elements of each stage so as to set every stage to be resonant at different frequencies of the frequency spectrum of the input signals; means for adjusting at least one of the adjustable reactance elements of each stage independently from other adjustable reactance elements of every other stage so as to selectively vary the amplitude of at least a selected one of the respective frequencies of the spectrum for altering the level of attenuation at said selected one frequency, whereby the output signals supplied to the load have the desired attenuation versus frequency characteristic for the entire frequency spectrum; and an output transformer for at least one of said stages, said output transformer being operatively connected between the output of said one stage and the load.

10. A network as defined in claim 9, wherein said one stage comprises a differential capacitor having two stator plate input terminals and a rotor plate output terminal, and wherein said output transformer has opposite end junctions and a tap junction intermediate the end junctions, at least one of said junctions being connected to the rotor plate output terminal of said one stage.

11. A network as defined in claim 9; and further comprising a plurality of decoupling resistors connected between respective different ones of said junctions.

12. A corrective equalizer network for obtaining a desired attenuation versus frequency characteristic, comprising a source having output terminals; a plurality of non-active stages each having an input connected across the output terminals of the source for receiving input signals from the latter, an output for supplying output signals to a load, and adjustable reactance elements intermediate the respective input and output of every stage; means for tuning at least one of the adjustable reactance elements of each stage so as to set every stage to be resonant at different frequencies of the frequency spectrum of the input signals; means for adjusting at least one of the adjustable reactance elements of each stage independently from other adjustable reactance elements of every other stage so as to selectively vary the amplitude of at least a selected one of the respective frequencies of the spectrum for altering the level of attenuation at said selected one frequency, whereby the output signals supplied to the load have the desired attenuation versus frequency characteristic for the entire frequency spectrum; and a voltage-dropping resistor having one end connected to the inputs of all of the stages, and another end connected to the load, all of said outputs of said stages being connected to said other end of said dropping resistor so as to substantially reduce the total insertion loss of the network.

13. A network as defined in claim 12, wherein each stage comprises a differential capacitor having two stator plate input terminals and a rotor plate output terminal, said stator plate input terminals being connected to respective ones of the output terminals of the source.

14. A network as defined in claim 12, wherein each stage comprises a differential capacitor having two stator plate input terminals and a rotor plate output terminal; and further comprising decoupling means connected between the rotor plate output terminals of the resonant circuit stages.

15. A network as defined in claim 12; and further comprising an input transformer located intermediate the source and the plurality of resonant circuit stages, said input transformer having a plurality of taps each connected to a respective input end of the stages.

16. A network as defined in claim 12, and wherein at least one of the stages further comprises an output transformer operatively connected intermediate the output of the stage and the load.

* * * * *